(12) United States Patent
Kang et al.

(10) Patent No.: US 6,380,748 B1
(45) Date of Patent: Apr. 30, 2002

(54) APPARATUS AND METHOD FOR DIAGNOSING ANTENNAS USING SWITCHES

(75) Inventors: Min Soo Kang; Churl Hur; Seok Jun Hong, all of Kyoungki-do; Yang Seok Song, Seoul, all of (KR)

(73) Assignee: Hyundai Electronics Industries Co., Ltd., Kyoungki-Do (KR)

(*) Notice: Subject to any disclaimer, the term of this patent is extended or adjusted under 35 U.S.C. 154(b) by 0 days.

(21) Appl. No.: 09/707,607

(22) Filed: Nov. 7, 2000

(30) Foreign Application Priority Data

Nov. 10, 1999 (KR) .............................................. 99-49635

(51) Int. Cl.[7] .............................................. G01R 27/06
(52) U.S. Cl. ........................ 324/645; 324/646; 343/703; 343/876
(58) Field of Search ................................ 324/645, 637, 324/642, 646, 123 R; 343/703, 876

(56) References Cited

U.S. PATENT DOCUMENTS

| | | | | |
|---|---|---|---|---|
| 3,222,677 A | * | 12/1965 | Fink | 343/876 |
| 4,110,685 A | * | 8/1978 | Leenerts | 324/123 R |
| 4,580,092 A | * | 4/1986 | Squire | 324/646 |
| 4,593,409 A | * | 6/1986 | Miller | 320/134 |
| 5,471,649 A | | 11/1995 | Pickersgill et al. | |
| 6,313,644 B1 | * | 11/2001 | Kim et al. | 324/642 |

* cited by examiner

*Primary Examiner*—Safet Metjahic
*Assistant Examiner*—Vincent Q. Nguyen
(74) *Attorney, Agent, or Firm*—Merchant & Gould P.C.

(57) ABSTRACT

An apparatus and method for diagnosing antennas using switches, wherein a system is configured in such a manner that a plurality of switches determine a data flow of a signal for test. Therefore, the antenna diagnosing apparatus can be so simplified in circuitry construction that it can be easy to manufacture at low cost. Further, the antenna diagnosing apparatus can accurately measure standing wave ratios of the antennas without being subject to any error, so as to accurately diagnose the performance of the antennas.

9 Claims, 3 Drawing Sheets

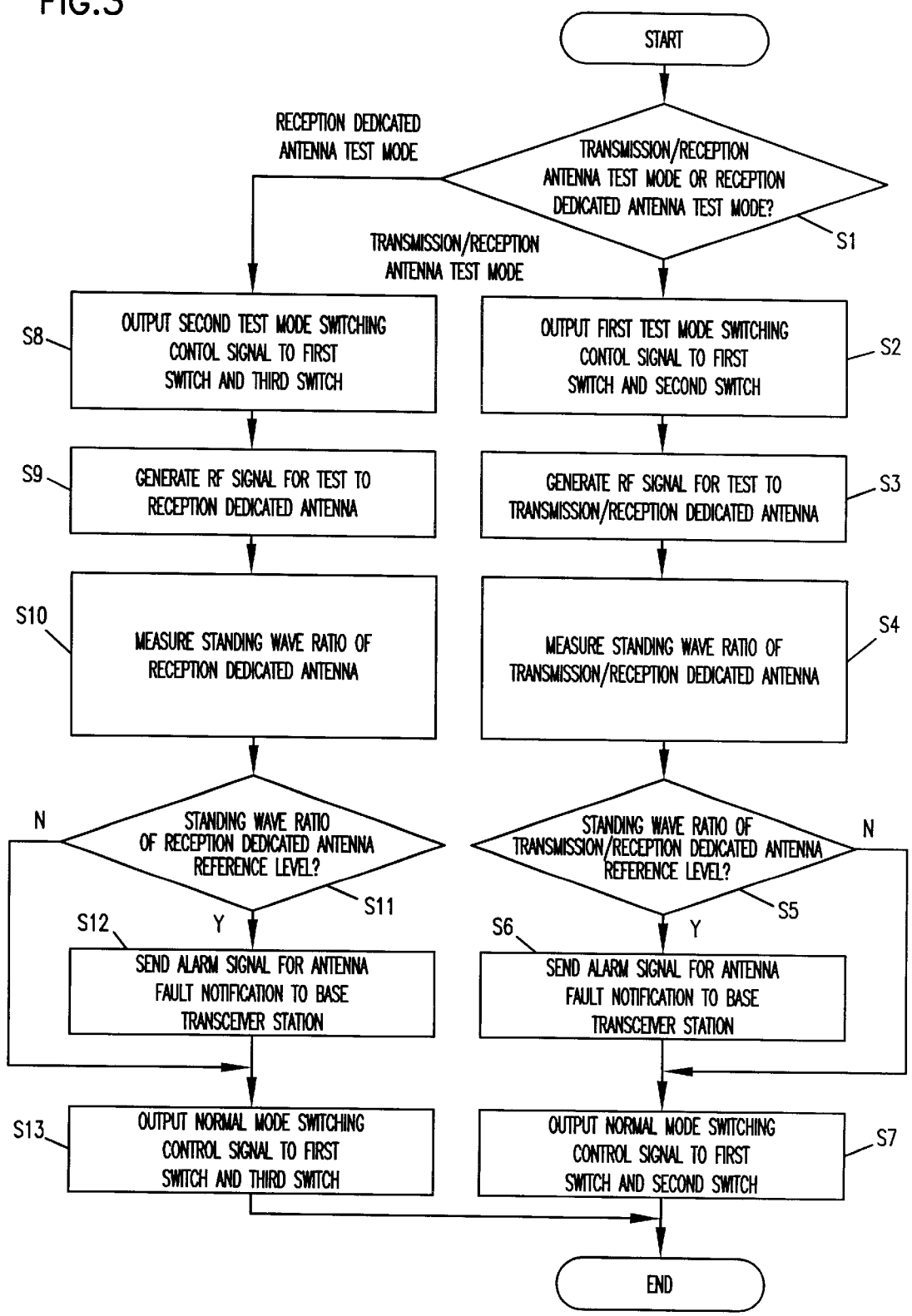

APPARATUS AND METHOD FOR DIAGNOSING ANTENNAS USING SWITCHES

BACKGROUND OF THE INVENTION

1. Field of the Invention

The present invention relates in general to an apparatus and method for diagnosing antennas using switches, and more particularly to an apparatus and method for diagnosing antennas using switches, wherein a system is configured in such a manner that a plurality of switches determine a data flow of a signal for test, so that the antenna diagnosing apparatus can be simplified in circuitry construction and accurately diagnose the performance of the antennas without being subject to any error.

2. Description of the Prior Art

FIG. 1 is a functional block diagram showing the construction of a conventional antenna diagnosing apparatus. As shown in this drawing, the conventional antenna diagnosing apparatus comprises a key input unit 1, controller 2, transmission/reception block 3, first 4-port directional coupler 4, transmission/reception antenna 5, switch 6, first comparator 7, first amplifier 8, second 4-port directional coupler 9, third 4-port directional coupler 10, reception dedicated antenna 11, second amplifier 12, third amplifier 13 and second comparator 14.

The operation of the conventional antenna diagnosing apparatus with the above-mentioned construction will hereinafter be described with reference to FIG. 1.

First, if the user selects a transmission/reception antenna test mode through the key input unit 1, then the controller 2 outputs a switch control signal to the switch 6 such that a terminal a of the switch 6 is connected to a terminal b thereof. The controller 2 further outputs a transmission control signal to the transmission/reception block 3. In response to the transmission control signal from the controller 2, the transmission/reception block 3 outputs a radio frequency (referred to hereinafter as "RF") signal for test to the transmission/reception antenna 5. At this time, the first 4-port directional coupler 4 sets up a first path along which the test RF signal from the transmission/reception block 3 is transferred to the first comparator 7 through the transmission/reception antenna 5 and a second path along which the test RF signal from the transmission/reception block 3 is transferred to the first comparator 7 directly, not through the transmission/reception antenna 5. Then, the first comparator 7 compares the level of the test RF signal returned via the transmission/reception antenna 5 with that of the test RF signal returned directly, not via the transmission/reception antenna 5, to measure a standing wave ratio of the transmission/reception antenna 5, which is used to diagnose a faulty state of the transmission/reception antenna 5. Herein, the standing wave ratio of the antenna signifies a ratio of the level of an RF signal transmitted through the antenna to the level of an RF signal not transmitted through the antenna but reflected into the system. As a result, the state of the antenna can be diagnosed on the basis of the standing wave ratio of the antenna.

On the other hand, if the user selects a reception dedicated antenna test mode through the key input unit 1, then the controller 2 outputs a switch control signal to the switch 6 such that the terminal a of the switch 6 is connected to a terminal c thereof. The controller 2 further outputs a transmission control signal to the transmission/reception block 3. In response to the transmission control signal from the controller 2, the transmission/reception block 3 outputs an RF signal for test to the reception dedicated antenna 11. At this time, the first 4-port directional coupler 4 and second 4-port directional coupler 9 cooperate to set up a path along which the test RF signal from the transmission/reception block 3 is transferred only to the reception dedicated antenna Upon receiving the test RF signal from the transmission/reception block 3 via the first 4-port directional coupler 4 and switch 6, the first amplifier 8 amplifies the received test RF signal to a predetermined level and then outputs the amplified test RF signal to the reception dedicated antenna 11. At this time, the third 4-port directional coupler 10 sets up a first path along which the amplified test RF signal from the first amplifier 8 is transferred to the second comparator 14 through the reception dedicated antenna 11 and a second path along which the amplified test RF signal from the first amplifier 8 is transferred to the second comparator 14 directly, not through the reception dedicated antenna 11. The second amplifier 12 amplifies the test RF signal returned via the reception dedicated antenna 11 to a predetermined level and then outputs the amplified test RF signal to the second comparator 14. The third amplifier 13 amplifies the test RF signal returned directly, not via the reception dedicated antenna 11, to a predetermined level and then outputs the amplified test RF signal to the second comparator 14. Then, the second comparator 14 compares the level of the amplified test RF signal from the second amplifier 12 with that of the amplified test RF signal from the third amplifier 13 and measures a standing wave ratio of the reception dedicated antenna 11 in accordance with the compared result. Accordingly, a faulty operation of the reception dedicated antenna 11 is diagnosed on the basis of the measured standing wave ratio.

However, the above-described conventional antenna diagnosing apparatus is disadvantageous in that additional components such as a plurality of 4-port directional couplers and a plurality of amplifiers are used to implement a system, resulting in a complexity in circuitry construction and an increase in manufacturing cost. Further, there is a high possibility that data errors will occur when a plurality of 4-port directional couplers determine the flow of a test RF signal, thereby making it impossible to accurately measure a standing wave ratio of an antenna.

SUMMARY OF THE INVENTION

Therefore, the present invention has been made in view of the above problems, and it is an object of the present invention to provide an apparatus and method for diagnosing antennas using switches, wherein a system is configured in such a manner that a plurality of switches determine a data flow of a signal for test, thereby allowing the antenna diagnosing apparatus to be so simplified in circuitry construction that it can be easy to manufacture at low cost, and to accurately measure standing wave ratios of the antennas without being subject to any error, so as to accurately diagnose the performance of the antennae.

In accordance with one aspect of the present invention, the above and other objects can be accomplished by a provision of an apparatus for diagnosing states of a transmission/reception antenna and a reception dedicated antenna using first to third switches, comprising key input means for generating a transmission/reception antenna test mode signal or reception dedicated antenna test mode signal if the user selects a transmission/reception antenna test mode or reception dedicated antenna test mode to diagnose the state of the transmission/reception antenna or reception dedicated antenna; control means for generating an oscillator operation control signal and a first test mode switching control signal in response to the transmission/reception antenna test mode signal from the key input means and the oscillator operation control signal and a second test mode switching control signal in response to the reception dedicated antenna test mode signal from the key input means, respectively; standing wave ratio detection means for generating a radio frequency signal for test to the transmission/reception antenna or reception dedicated antenna in response to the oscillator operation control signal from the control means, comparing the level of the test radio frequency signal returned via the transmission/reception antenna or reception dedicated antenna with a reference radio frequency power level, measuring a standing wave ratio of the transmission/reception antenna or reception dedicated antenna in accordance with the compared result and sending an alarm signal for antenna fault notification to a base transceiver station if the measured standing wave ratio is lower than a reference level for fault determination; the first switch connecting the standing wave ratio detection means to the transmission/reception antenna in response to the first test mode switching control signal from the control means and the standing wave ratio detection means to the reception dedicated antenna in response to the second test mode switching control signal from the control means, respectively; the second switch connecting the standing wave ratio detection means to the transmission/reception antenna in response to the first test mode switching control signal from the control means and a receiver of the base transceiver station to the transmission/reception antenna in response to a normal mode switching control signal from the control means, respectively; and the third switch connecting the standing wave ratio detection means to the reception dedicated antenna in response to the second test mode switching control signal from the control means and the receiver of the base transceiver station to the reception dedicated antenna in response to the normal mode switching control signal from the control means, respectively.

In accordance with another aspect of the present invention, there is provided a method for diagnosing states of a transmission/reception antenna and a reception dedicated antenna using first to third switches, comprising the steps of a) allowing a controller to determine whether the user selects a transmission/reception antenna test mode or reception dedicated antenna test mode through a key input unit; b) allowing the controller to output a first test mode switching control signal to the first switch and second switch if the user selects the transmission/reception antenna test mode through the key input unit at the step a), so as to connect the transmission/reception antenna to a standing wave detector; c) allowing an oscillator to generate a radio frequency signal for test to the transmission/reception antenna in response to an oscillator operation control signal from the controller; d) allowing the standing wave ratio detector to compare the level of the test radio frequency signal from the oscillator returned via the transmission/reception antenna with a reference radio frequency power level and measure a standing wave ratio of the transmission/reception antenna in accordance with the compared result; e) allowing the standing wave ratio detector to compare the measured standing wave ratio of the transmission/reception antenna with a reference level for fault determination to determine whether the measured standing wave ratio is lower than the reference level; and f) allowing the standing wave ratio detector to send an alarm signal for antenna fault notification to a base transceiver station if the standing wave ratio of the transmission/reception antenna is determined to be lower than the reference level for fault determination at the step e).

BRIEF DESCRIPTION OF THE DRAWINGS

The above and other objects, features and advantages of the present invention will be more clearly understood from the following detailed description taken in conjunction with the accompanying drawings, in which:

FIG. 3 is a flowchart illustrating a method for diagnosing antennas using switches in accordance with the present invention.

DETAILED DESCRIPTION OF THE PREFERRED EMBODIMENTS

Figure 1:
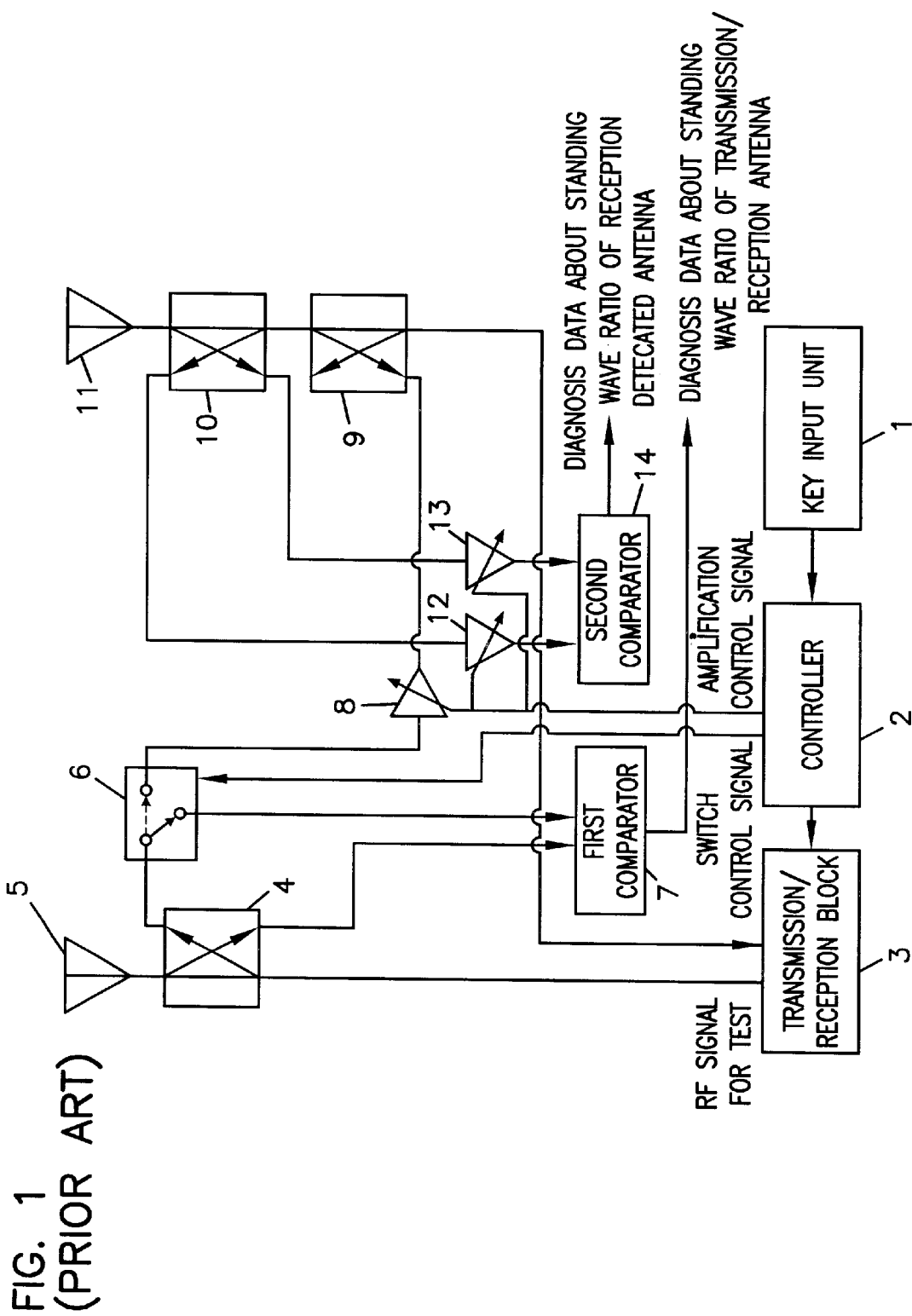
FIG. 1 is a functional block diagram showing the construction of a conventional antenna diagnosing apparatus.
Figure 2:
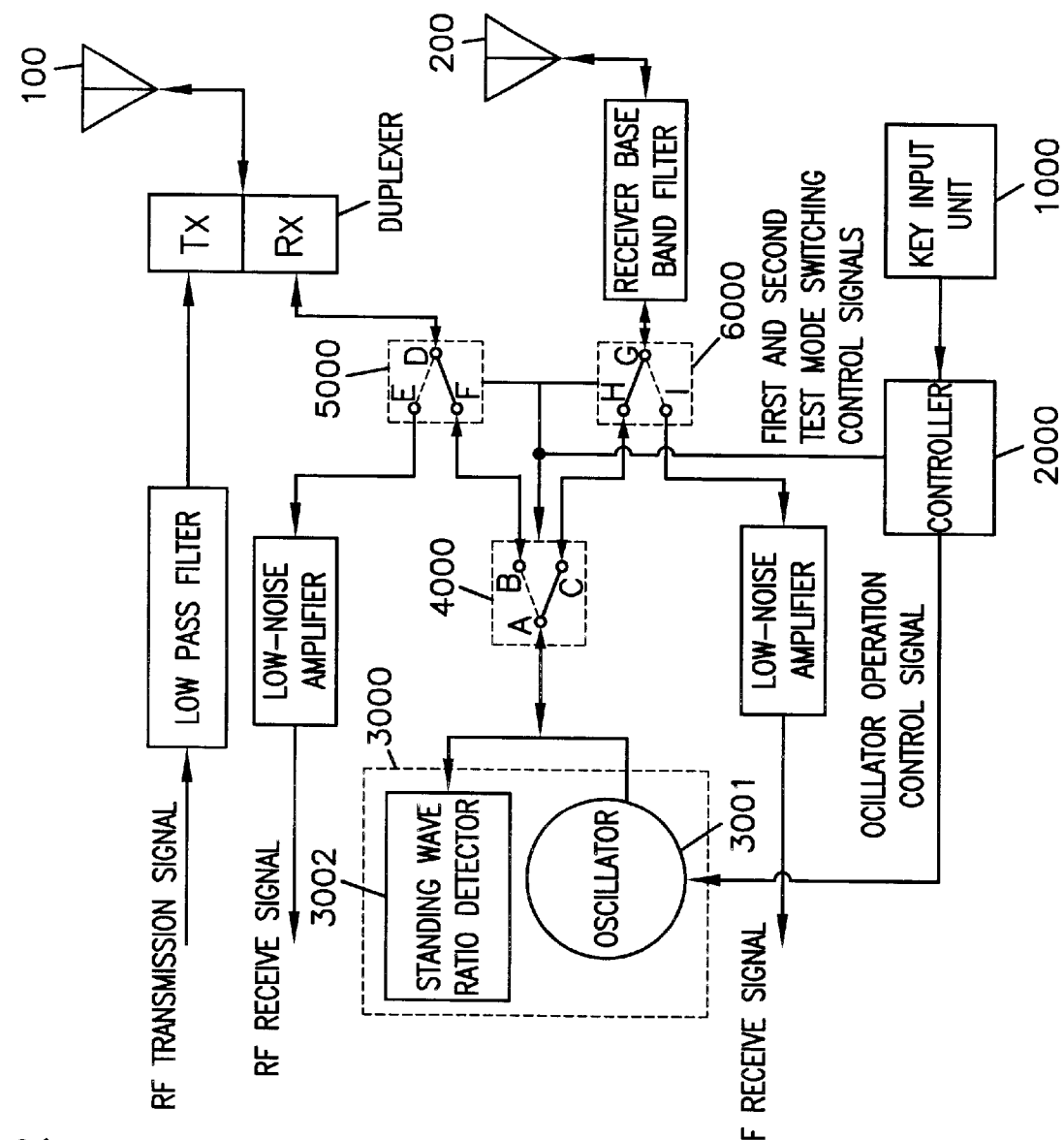
FIG. 2 is a functional block diagram showing the construction of an apparatus for diagnosing antennas using switches in accordance with the present invention.

FIG. 2 is a functional block diagram showing the construction of an apparatus for diagnosing antennas using switches in accordance with the present invention. As shown in this drawing, the antenna diagnosing apparatus of the present invention comprises a key input unit 1000, controller 2000, standing wave ratio detection circuit 3000, first switch 4000, second switch 5000 and third switch 6000.

The key input unit 1000 acts to output a transmission/reception antenna test mode signal or reception dedicated antenna test mode signal to the controller 2000 if the user selects a transmission/reception antenna test mode or reception dedicated antenna test mode to diagnose the state of a transmission/reception antenna 100 or reception dedicated antenna 200 of a base transceiver station.

The controller 2000 is adapted to output a first test mode switching control signal to the first switch 4000 and second switch 5000 in response to the transmission/reception antenna test mode signal from the key input unit 1000 such that the standing wave ratio detection circuit 3000 is connected to the transmission/reception antenna 100 through the first and second switches 4000 and 5000. The controller 2000 is further adapted to output an oscillator operation control signal to the standing wave ratio detection circuit 3000. The controller 2000 is further adapted to, if a diagnosis of the transmission/reception antenna 100 is completed by means of the standing wave ratio detection circuit 3000, output a normal mode switching control signal to the first switch 4000 and second switch 5000 such that a receiver of the base transceiver station is connected to the transmission/reception antenna 100 through the first and second switches 4000 and 5000.

On the other hand, the controller 2000 is adapted to output a second test mode switching control signal to the first switch 4000 and third switch 6000 in response to the reception dedicated antenna test mode signal from the key input unit 1000 such that the standing wave ratio detection circuit 3000 is connected to the reception dedicated antenna 200 through the first and third switches 4000 and 6000. The controller 2000 is further adapted to output the oscillator operation control signal to the standing wave ratio detection circuit 3000. The controller 2000 is further adapted to, if a diagnosis of the reception dedicated antenna 200 is completed by means of the standing wave ratio detection circuit 3000, output the normal mode switching control signal to the first switch 4000 and third switch 6000 such that the receiver of the base transceiver station is connected to the reception dedicated antenna 200 through the first and third switches 4000 and 6000.

The standing wave ratio detection circuit 3000 functions to output an RF signal for test to the transmission/reception antenna 100 or reception dedicated antenna 200 in response to the oscillator operation control signal from the controller 2000. The standing wave ratio detection circuit 3000 further functions to compare the level of the test RF signal returned via the transmission/reception antenna 100 or reception dedicated antenna 200 with a reference RF power level and measure a standing wave ratio of the transmission/reception antenna 100 or reception dedicated antenna 200 in accordance with the compared result. The standing wave ratio detection circuit 3000 further functions to send an alarm signal for antenna fault notification to the base transceiver station if the measured standing wave ratio is lower than a reference level for fault determination. To this end, the standing wave ratio detection circuit 3000 includes an oscillator 3001 and a standing wave ratio detector 3002.

In the standing wave ratio detection circuit 3000, the oscillator 3001 acts to output the test RF signal to the transmission/reception antenna 100 or reception dedicated antenna 200 in response to the oscillator operation control signal from the controller 2000.

The standing wave ratio detector 3002 in the standing wave ratio detection circuit 3000 is adapted to contain the reference RF power level, which is equal to that of the RF signal for test from the oscillator 3001. The standing wave ratio detector 3002 compares the level of the test RF signal from the oscillator 3001 returned via the transmission/reception antenna 100 or reception dedicated antenna 200 with the reference RF power level, measures the standing wave ratio of the transmission/reception antenna 100 or reception dedicated antenna 200 in accordance with the compared result and sends the alarm signal for antenna fault notification to the base transceiver station if the measured standing wave ratio is lower than the reference level for fault determination.

The first switch 4000 acts to connect its terminal a to its terminal b in response to the first test mode switching control signal from the controller 2000 such that the standing wave ratio detection circuit 3000 is connected to the transmission/reception antenna 100. The first switch 4000 further acts to connect its terminal a to its terminal c in response to the second test mode switching control signal from the controller 2000 such that the standing wave ratio detection circuit 3000 is connected to the reception dedicated antenna 200.

The second switch 5000 acts to connect its terminal d to its terminal f in response to the first test mode switching control signal from the controller 2000 such that the standing wave ratio detection circuit 3000 is connected to the transmission/reception antenna 100. The second switch 5000 further acts to connect its terminal d to its terminal e in response to the normal mode switching control signal from the controller 2000 such that a low-noise amplifier is connected to the transmission/reception antenna 100.

The third switch 6000 acts to connect its terminal g to its terminal h in response to the second test mode switching control signal from the controller 2000 such that the standing wave ratio detection circuit 3000 is connected to the reception dedicated antenna 200. The third switch 6000 further acts to connect its terminal g to its terminal i in response to the normal mode switching control signal from the controller 2000 such that the receiver of the base transceiver station is connected to the reception dedicated antenna 200.

Next, a detailed description will be given of a method for diagnosing antennas using the antenna diagnosing apparatus with the above-stated construction in accordance with the present invention with reference to FIG. 3.

FIG. 3 is a flowchart illustrating a method for diagnosing antennas using switches in accordance with the present invention, wherein the reference character "S" denotes steps.

First, the controller 2000 determines at step S1 whether the user selects the transmission/reception antenna test mode or reception dedicated antenna test mode through the key input unit 1000.

If the user selects the transmission/reception antenna test mode through the key input unit 1000 at the above step S1, then the controller 2000 outputs the first test mode switching control signal to the first switch 4000 and second switch 5000 at step S2, thereby causing the first and second switches 4000 and 5000 to connect the transmission/reception antenna 100 to the standing wave detection circuit 3000. In more detail, in response to the first test mode switching control signal from the controller 2000, the first switch 4000 connects its terminal a to its terminal b such that the transmission/reception antenna 100 is connected to the standing wave detection circuit 3000. Also, in response to the first test mode switching control signal from the controller 2000, the second switch 5000 connects its terminal d to its terminal f such that the transmission/reception antenna 100 is connected to the standing wave detection circuit 3000.

Further, the controller 2000 outputs the oscillator operation control signal to the oscillator 3001 in the standing wave ratio detection circuit 3000.

In response to the oscillator operation control signal from the controller 2000, the oscillator 3001 generates an RF signal for test to the transmission/reception antenna 100 at step S3.

The standing wave ratio detector 3002 in the standing wave ratio detection circuit 3000 compares the level of the test RF signal from the oscillator 3001 returned via the transmission/reception antenna 100 with the reference RF power level and measures the standing wave ratio of the transmission/reception antenna 100 in accordance with the compared result at step S4.

Thereafter, the standing wave ratio detector 3002 compares the measured standing wave ratio of the transmission/reception antenna 100 with the reference level for fault determination at step S5 to determine whether the measured standing wave ratio is lower than the reference level.

If the standing wave ratio of the transmission/reception antenna 100 is determined to be lower than the reference level for fault determination at the above step S5, the standing wave ratio detector 3002 sends the alarm signal for antenna fault notification to the base transceiver station at step S6. Upon receiving the alarm signal for antenna fault notification from the standing wave ratio detector 3002, the base transceiver station displays a message about the fact that the transmission/reception antenna 100 is out of order, so as to notify the user of it.

Thereafter, if the antenna diagnosing operation is completed, then the controller 2000 outputs the normal mode switching control signal to the first switch 4000 and second switch 5000 at step S7 to again normally connect the transmission/reception antenna 100 to the receiver of the base transceiver station.

On the other hand, in the case where the standing wave ratio of the transmission/reception antenna 100 is determined to be higher than or equal to the reference level for fault determination at the above step S5, the standing wave ratio detector 3002 notifies the controller 2000 of such a fact. Then, the controller 2000 determines the transmission/reception antenna 100 to be normal and proceeds to the above step S7.

On the other hand, in the case where the user selects the reception dedicated antenna test mode through the key input unit 1000 at the above step S1, the controller 2000 outputs the second test mode switching control signal to the first switch 4000 and third switch 6000 at step S8. In response to the second test mode switching control signal from the controller 2000, the first switch 4000 connects its terminal a to its terminal c such that the reception dedicated antenna 200 is connected to the standing wave detection circuit 3000. Also, in response to the second test mode switching control signal from the controller 2000, the third switch 6000 connects its terminal g to its terminal h such that the reception dedicated antenna 200 is connected to the standing wave detection circuit 3000.

Then, the controller 2000 outputs the oscillator operation control signal to the oscillator 3001 in the standing wave ratio detection circuit 3000, thereby causing the oscillator 3001 to generate an RF signal for test to the reception dedicated antenna 200 at step S9.

The standing wave ratio detector 3002 in the standing wave ratio detection circuit 3000 compares the level of the test RF signal from the oscillator 3001 returned via the reception dedicated antenna 200 with the reference RF power level and measures the standing wave ratio of the reception dedicated antenna 200 in accordance with the compared result at step S10.

Subsequently, the standing wave ratio detector 3002 compares the measured standing wave ratio of the reception dedicated antenna 200 with the reference level for fault determination at step S11 to determine whether the measured standing wave ratio is lower than the reference level.

In the case where the standing wave ratio of the reception dedicated antenna 200 is determined to be lower than the reference level for fault determination at the above step S11, the standing wave ratio detector 3002 sends the alarm signal for antenna fault notification to the base transceiver station at step S12. In response to the alarm signal for antenna fault notification from the standing wave ratio detector 3002, the base transceiver station displays a message about the fact that the reception dedicated antenna 200 is out of order, so as to notify the user of it.

Thereafter, if the antenna diagnosing operation is completed, then the controller 2000 outputs the normal mode switching control signal to the first switch 4000 and third switch 6000 at step S13 to again normally connect the reception dedicated antenna 200 to the receiver of the base transceiver station.

On the other hand, if the standing wave ratio of the reception dedicated antenna 200 is determined to be higher than or equal to the reference level for fault determination at the above step S11, the standing wave ratio detector 3002 notifies the controller 2000 of such a fact. Then, the controller 2000 determines the reception dedicated antenna 200 to be normal and proceeds to the above step S13.

As apparent from the above description, the present invention provides an apparatus and method for diagnosing antennas using switches, wherein a system is configured in such a manner that a plurality of switches is provided instead of a plurality of conventional 4-port directional couplers to determine a data flow of a signal for test. Therefore, the antenna diagnosing apparatus can be so simplified in circuitry construction that it can be easy to manufacture at low cost. Further, the antenna diagnosing apparatus can accurately measure standing wave ratios of the antennas without being subject to any error, so as to accurately diagnose the performance of the antennas. Moreover, two antennas are alternately diagnosed with little effect on the performance of a base transceiver station or mobile switching center in a mobile telecommunication system. This has the effect of accurately monitoring the states of the antennas and rapidly and efficiently conducting the maintenance of the base transceiver station or mobile switching center in accordance with the monitored results.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for diagnosing states of a transmission/reception antenna and a reception dedicated antenna using first to third switches, comprising:

key input means for generating a transmission/reception antenna test mode signal or reception dedicated antenna test mode signal if the user selects a transmission/reception antenna test mode or reception dedicated antenna test mode to diagnose the state of said transmission/reception antenna or reception dedicated antenna;

control means for generating an oscillator operation control signal and a first test mode switching control signal in response to said transmission/reception antenna test mode signal from said key input means and said oscillator operation control signal and a second test mode switching control signal in response to said reception dedicated antenna test mode signal from said key input means, respectively;

standing wave ratio detection means for generating a radio frequency signal for test to said transmission/reception antenna or reception dedicated antenna in response to said oscillator operation control signal from said control means, comparing the level of said test radio frequency signal returned via said transmission/reception antenna or reception dedicated antenna with a reference radio frequency power level, measuring a standing wave ratio of said transmission/reception antenna or reception dedicated antenna in accordance with the compared result and sending an alarm signal for antenna fault notification to a base transceiver station if the measured standing wave ratio is lower than a reference level for fault determination;

said first switch connecting said standing wave ratio detection means to said transmission/reception antenna in response to said first test mode switching control signal from said control means and said standing wave ratio detection means to said reception dedicated antenna in response to said second test mode switching control signal from said control means, respectively;

said second switch connecting said standing wave ratio detection means to said transmission/reception antenna in response to said first test mode switching control signal from said control means and a receiver of said base transceiver station to said transmission/reception antenna in response to a normal mode switching control signal from said control means, respectively; and said third switch connecting said standing wave ratio detection means to said reception dedicated antenna in response to said second test mode switching control signal from said control means and said receiver of said base transceiver station to said reception dedicated antenna in response to said normal mode switching control signal from said control means, respectively.

2. The apparatus as set forth in claim 1, wherein said control means is adapted to generate said normal mode switching control signal if a procedure of diagnosing the state of said transmission/reception antenna or reception dedicated antenna is completed.

3. The apparatus as set forth in claim 1, wherein said standing wave ratio detection means includes:

an oscillator for generating said test radio frequency signal to said transmission/reception antenna or reception dedicated antenna in response to said oscillator operation control signal from said control means; and a standing wave ratio detector containing said reference radio frequency power level, which is equal to that of said radio frequency signal for test from said oscillator, said standing wave ratio detector comparing the level of said test radio frequency signal from said oscillator returned via said transmission/reception antenna or reception dedicated antenna with said reference radio frequency power level, measuring said standing wave ratio of said transmission/reception antenna or reception dedicated antenna in accordance with the compared result and sending said alarm signal for antenna fault notification to said base transceiver station if the measured standing wave ratio is lower than said reference level for fault determination.

4. A method for diagnosing states of a transmission/reception antenna and a reception dedicated antenna using first to third switches, comprising the steps of:

a) allowing a controller to determine whether the user selects a transmission/reception antenna test mode or reception dedicated antenna test mode through a key input unit;

b) allowing said controller to output a first test mode switching control signal to said first switch and second switch if the user selects said transmission/reception antenna test mode through said key input unit at said step a), so as to connect said transmission/reception antenna to a standing wave detector;

c) allowing an oscillator to generate a radio frequency signal for test to said transmission/reception antenna in response to an oscillator operation control signal from said controller;

d) allowing said standing wave ratio detector to compare the level of said test radio frequency signal from said oscillator returned via said transmission/reception antenna with a reference radio frequency power level and measure a standing wave ratio of said transmission/reception antenna in accordance with the compared result;

e) allowing said standing wave ratio detector to compare the measured standing wave ratio of said transmission/reception antenna with a reference level for fault determination to determine whether the measured standing wave ratio is lower than the reference level; and f) allowing said standing wave ratio detector to send an alarm signal for antenna fault notification to a base transceiver station if said standing wave ratio of said transmission/reception antenna is determined to be lower than said reference level for fault determination at said step e).

5. The method as set forth in claim 4, further comprising the step of g) allowing said controller to output a normal mode switching control signal to said first and second switches after said step f) is performed, so as to connect said transmission/reception antenna to a receiver of said base transceiver station.

6. The method as set forth in claim 5, further comprising the step of h) proceeding to said step g) if said standing wave ratio of said transmission/reception antenna is determined to be higher than or equal to said reference level for fault determination at said step e).

7. The method as set forth in claim 4, further comprising the steps of:

g) allowing said controller to output a second test mode switching control signal to said first switch and third switch if the user selects said reception dedicated antenna test mode through said key input unit at said step a), so as to connect said reception dedicated antenna to said standing wave detector;

h) allowing said oscillator to generate said radio frequency signal for test to said reception dedicated antenna in response to said oscillator operation control signal from said controller;

i) allowing said standing wave ratio detector to compare the level of said test radio frequency signal from said oscillator returned via said reception dedicated antenna with said reference radio frequency power level and measure a standing wave ratio of said reception dedicated antenna in accordance with the compared result;

j) allowing said standing wave ratio detector to compare the measured standing wave ratio of said reception dedicated antenna with said reference level for fault determination to determine whether the measured standing wave ratio is lower than the reference level; and k) allowing said standing wave ratio detector to send said alarm signal for antenna fault notification to said base transceiver station if said standing wave ratio of said reception dedicated antenna is determined to be lower than said reference level for fault determination at said step j).

8. The method as set forth in claim 7, further comprising the step of l) allowing said controller to output a normal mode switching control signal to said first and third switches after said step k) is performed, so as to connect said reception dedicated antenna to a receiver of said base transceiver station.

9. The method as set forth in claim 8, further comprising the step of m) proceeding to said step l) if said standing wave ratio of said reception dedicated antenna is determined to be higher than or equal to said reference level for fault determination at said step j).

\* \* \* \* \*